(12) United States Patent
Delforge et al.

(10) Patent No.: US 8,890,528 B2
(45) Date of Patent: Nov. 18, 2014

(54) RF POWER TRANSMITTER

(75) Inventors: Adrian Delforge, Rockport, MA (US);
Louis Poulo, Andover, MA (US)

(73) Assignee: Analogic Corporation, Peabody, MA (US)

( * ) Notice: Subject to any disclaimer, the term of this patent is extended or adjusted under 35 U.S.C. 154(b) by 170 days.

(21) Appl. No.: 13/496,288

(22) PCT Filed: Sep. 18, 2009

(86) PCT No.: PCT/US2009/057461
§ 371 (c)(1),
(2), (4) Date: Mar. 15, 2012

(87) PCT Pub. No.: WO2011/034538
PCT Pub. Date: Mar. 24, 2011

(65) Prior Publication Data
US 2012/0179024 A1 Jul. 12, 2012

(51) Int. Cl.
*A61B 5/055* (2006.01)
*G01R 33/44* (2006.01)
*H04B 1/04* (2006.01)
*G01R 33/36* (2006.01)

(52) U.S. Cl.
CPC .............. *H04B 1/04* (2013.01); *G01R 33/3614* (2013.01); *G01R 33/3607* (2013.01)
USPC ........... 324/314; 324/307; 324/309; 324/318; 324/322; 600/407

(58) Field of Classification Search
USPC ........... 324/314, 318, 322, 307, 309; 600/410
See application file for complete search history.

(56) References Cited

U.S. PATENT DOCUMENTS

| 8,169,221 | B2* | 5/2012 | Griswold et al. | 324/322 |
| 2009/0134876 | A1* | 5/2009 | Griswold et al. | 324/318 |
| 2010/0141257 | A1* | 6/2010 | Graesslin et al. | 324/314 |
| 2010/0303733 | A1* | 12/2010 | Hyde et al. | 424/9.341 |

OTHER PUBLICATIONS

International search report for PCT/US09/57461 published as WO 2011/034538.

* cited by examiner

*Primary Examiner* — Baisakhi Roy
(74) *Attorney, Agent, or Firm* — Anthony M. Del Zoppo, III; Driggs, Hogg, Daugherty & Del Zoppo Co., LPA

(57) ABSTRACT

A RF power transmitter (100) includes an RF synthesizer (104) that generates an analog RF signal based on a digital description of the desired RF waveform and digital feedback signals and a power module (116) that amplifies the analog RF signal and provides the amplified analog RF signal (122) to a load (102).

19 Claims, 2 Drawing Sheets

RF POWER TRANSMITTER

RELATED APPLICATION

This application is a national filing of PCT application Serial No. PCT/US09/57461, filed Sep. 18, 2009, published as WO2011/034538 on Mar. 24, 2011.

TECHNICAL FIELD

The following generally relates to a radio frequency (RF) power transmitter and is described with particular application to a Magnetic Resonance (MR) imaging system. However, the RF power transmitter is also amenable to other applications, including non-MR applications.

BACKGROUND

A Magnetic Resonance (MR) imaging system generally includes a main magnet, gradient coils (x, y and z), an RF system, a transmit coil, and a receive coil. The main magnet polarizes protons in an object or subject (e.g., a human or animal patient) in an examination region. The gradient coils localize and spatially encode the positions of the protons. The RF system generates an excitation signal, and the transmit coil excite protons based on the excitation signal. The receive coil receives a MR signal produced in response to the protons returning to the pre-excite state. The transmit and receive coils may be the same coil or different coils. The received MR signal is processed and the processed data is used to generate one or more images of the scanned region of the object or subject.

In one MR system, the RF system includes a signal modulation and generation section electrically connected to a signal amplification section. The signal modulation and generation section creates a modulated digital waveform and generates an analog RF signal therefrom based on a predetermined carrier description and envelope. The analog RF signal is transmitted to the signal amplification section. The signal amplification section amplifies the analog RF signal, and the amplified analog RF signal is provided to the transmit coil. With this system, the signal amplification section is assumed to be "ideal", in that the signal amplification section is expected to amplify the analog input RF signal with high fidelity and provide an accurate high power replica of the low power input to the coil.

Unfortunately, the analog RF signal fed to the signal amplification section may not be "ideal" for the transmit coil in that its output to the coil may not follow the behavior of the low level input and the predetermined carrier description and envelope with sufficient accuracy for the application. As such, the signal amplification section may require additional analog circuitry which dynamically modifies the amplifier behavior or analog signals in order to deliver the desired high power analog output. The analog RF signal output may deviate from the desired output due to variations in the amplifier phase and gain due to various operating and environmental conditions (e.g., temperature, drift, output power level, etc.).

Current compensation techniques include detection of the actual output signal and/or various amplifier operating and environmental conditions, and using these measurements to implement corrections which tend to reduce the output errors. Compensation techniques may include modification of the amplifier characteristics (e.g., through changes in amplifier gain and phase), closed loop feedback, which modifies the applied input signal to the main amplifier based on a comparison of the ideal input and actual output, or a combination thereof.

SUMMARY

Aspects of the application address the above matters, and others.

In one aspect, a RF power transmitter includes an RF synthesizer that generates an analog RF signal based on an input digital waveform and digital feedback signals and a power module that amplifies the analog RF signal and provides the amplified analog RF signal to a load.

In another aspect, a method generating, via a RF power transmitter, an amplified analog RF signal for a transmitter coil of an MR imaging system based on an input digital waveform and a digital feedback signal. The method also includes providing the amplified analog RF signal to the transmitter coil.

In another aspect, an RF power transmitter generates an amplified analog RF signal. The RF power transmitter includes an RF synthesizer that generates an analog RF signal based on a digital waveform and a digital feedback signal, wherein the digital waveform includes an RF carrier description and an envelope description. The RF power transmitter also includes a power module that amplifies the analog RF signal, producing the amplified analog RF signal. A feedback component generates one or more digital feedback signals based on electrical characteristics of an output of the power module. The RF power transmitter provides the amplified analog RF signal to a transmit coil of an MR imaging system.

BRIEF DESCRIPTION OF THE DRAWINGS

The application is illustrated by way of example and not limitation in the figures of the accompanying drawings, in which like references indicate similar elements and in which.

DETAILED DESCRIPTION

Figure 1:
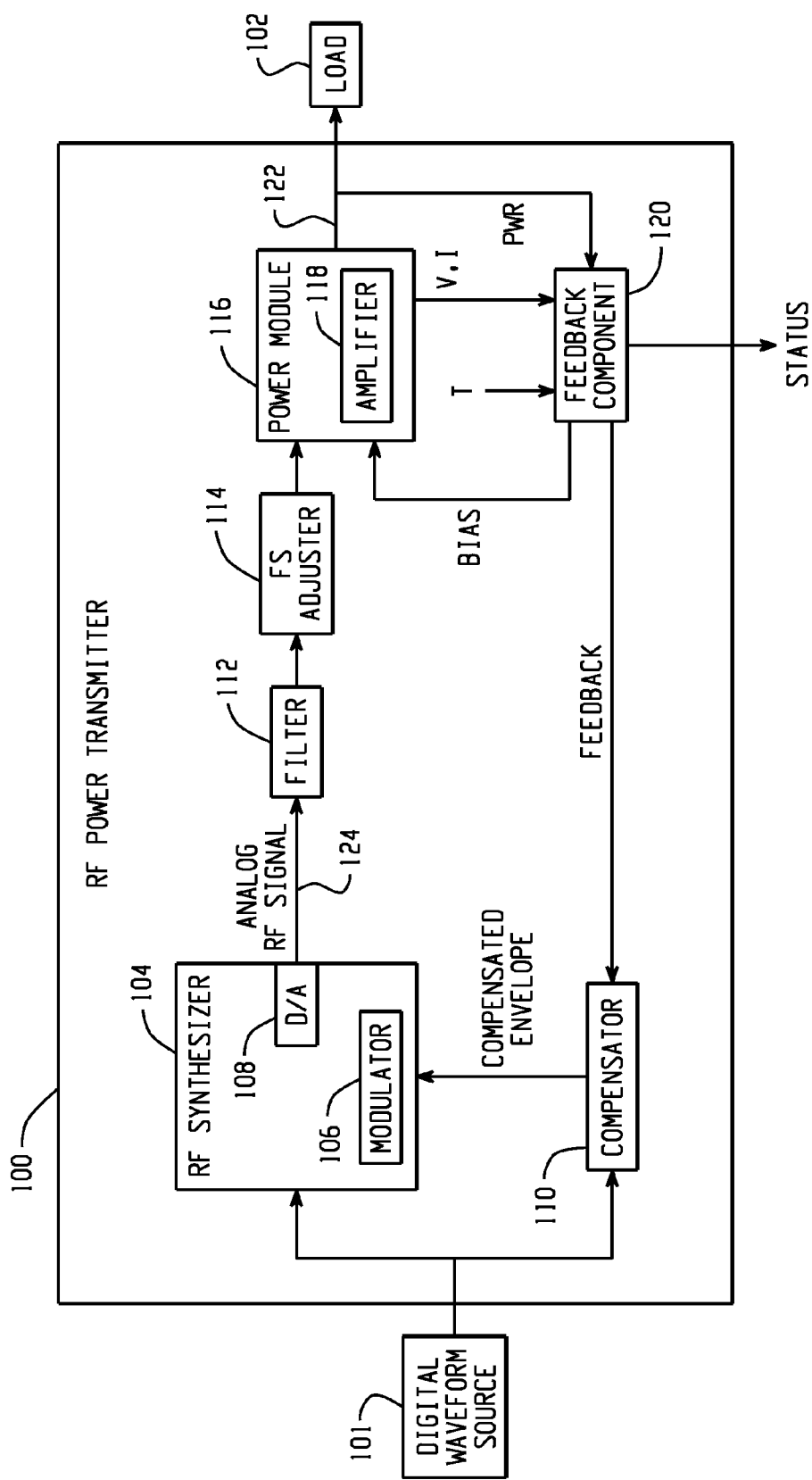
FIG. 1 illustrates an example RF power transmitter in connection with a DSP and load.

FIG. 1 illustrates an example RF power transmitter 100 in connection with a digital RF waveform source 101 and a load 102 such as a transmit coil of an MR imaging system or other system.

Generally, the RF power transmitter 100 generates an amplified analog RF signal 122, based on an input digital waveform from a source 101, various calibration measurements, and feedback indicative of the actual output and operating conditions, and provides the amplified analog RF signal 122 to the load 102. The input digital waveform includes a digital description of a predetermined or desired analog signal to be output by the power module 116, typically given as a combination of a complex baseband envelope description and an RF carrier description.

The RF power transmitter 100 includes an RF synthesizer 104 that generates an analog RF signal based on digital inputs, such as the input digital waveform with the carrier description and digital compensated dynamic envelope. The illustrated RF synthesizer 104 includes a modulator 106 that generates a modulated RF digital signal based on the digital input RF carrier description and the digital compensated dynamic envelope and a digital-to-analog converter (D/A) 108 that converts the modulated digital signal into the analog RF signal.

A compensator 110 generates the digital compensated dynamic envelope. In the illustrated embodiment, the compensator 110 generates the digital compensated dynamic envelope based on the digital dynamic complex envelope description of the desired output and a digital feedback signal. The digital compensated dynamic envelope represents a signal 124 output by the RF synthesizer that will lead to the desired amplified RF signal 122 for the load 102. The compensator 110 may also utilize one or more compensation models and/or the RF carrier description to generate the digital compensated dynamic envelope.

A filter 112 filters the analog RF signal generated by the RF synthesizer 104. In the illustrated embodiment, the filter 112 is configured to filter noise such as out of band noise from the analog RF signal. In other embodiments, one or more other filters may additionally or alternatively be employed.

A full-scale (FS) adjuster 114 determines a magnitude range for the analog RF signal. In the illustrated embodiment, the FS adjuster 114 is adjustable and used to set a static magnitude range.

A power module 116 at least amplifies the analog RF signal. The power module 116 may include various components such as an analog amplifier 118 (e.g., a class B amplifier), an isolator, a coupler, and/or other components, including one or more passive and active components. The illustrated power module 116 processes the filtered analog RF signal based on a bias feedback signal. The bias feedback signal compensates for temperature variations, time variations (e.g., drift), etc.

A feedback component 120 generates control bias signals based on various states of the RF power transmitter 100, such as device junction temperatures Tj, output power, and various voltages and currents in the module 116. The various states can be measured and/or estimated, for example, based on one or more models. Examples of such states include a temperature of and/or surrounding (e.g., ambient) the RF power transmitter 100, a supply voltage of the analog amplifier 118, an electrical current of the analog amplifier 118, a forward power (power output by the power module 116), a reflected power (power reflected back from the load 102 to the power module 116), and/or other state measurements and calculations. For forward and/or reflected power, one or more both of phase or amplitude can be considered.

The feedback component 120 also provides the feedback signals used by the compensator 110. In one embodiment, this feedback signal may include real-time or other state information and/or other information. The feedback component 120 also generates a status signal, which can be read and/or conveyed to another device, presented on a display in human readable format, printed to physical paper, and/or otherwise utilized.

In one instance, by using the input digital RF carrier description (from the digital waveform), the input digital dynamic envelope, and the digital feedback signal, the RF power transmitter 100 can use the original digital input signals as a reference to close a feedback loop within the RF power transmitter 100. This includes generating a digital correction (the compensated envelope) based on feedback of actual performance from within the RF power transmitter 100, wherein the correction controllably influences the output amplified analog RF signal 122, without using additional phase and/or gain terms in the analog domain in the analog RF signal amplification stage.

Furthermore, having the control in the digital domain may allow for improving noise characteristics (decreasing noise), eliminating nonlinear control mechanisms, extending diagnostic capability, reducing cost, and/or improving reliability.

Figure 2:
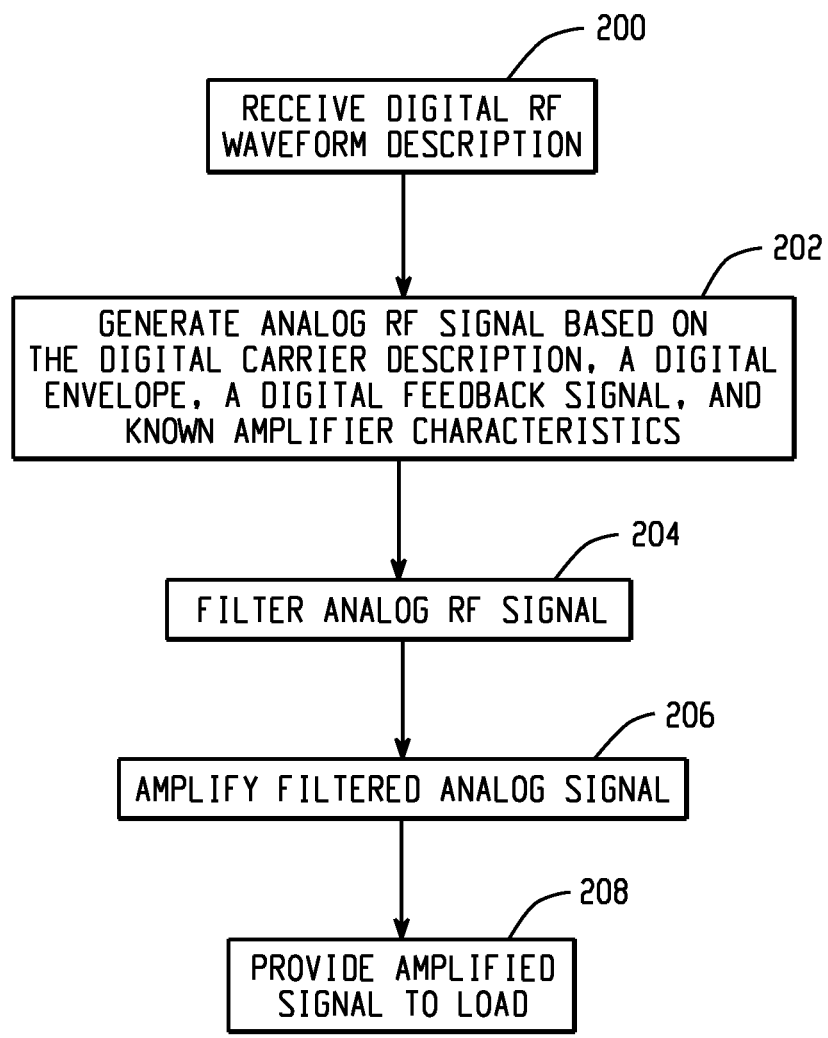
FIG. 2 illustrates a method for generating an analog RF signal for a load based on a digital waveform via the RF power transmitter of FIG. 1.

FIG. 2 illustrates a method for employing an RF power transmitter 100 to generate an amplified analog RF signal for a transmit coil of an MR system.

At 200, a digital RF waveform description is received. A suitable description includes an RF carrier description and a dynamic complex envelope.

At 202, an analog RF signal is generated based on the RF carrier description, the dynamic complex envelope RF, known non-ideal behavior of the amplifying system, and dynamic digital feedback. As discussed herein, the digital feedback signal includes real-time or estimated thermal, supply, output power, and/or other states of the RF power transmitter 100.

At 204, the generated analog RF signal is filtered.

At 206, the filtered analog RF signal is amplified.

At 208, the amplified analog RF signal is provided to a load 102 such as a transmit coil of the MR system.

The illustrated embodiment is discussed in connection with an MR system. It is to be appreciated that the RF power amplifier 100 can also be used with other systems where it is desirable to generate an amplified analog RF signal.

The application has been described with reference to various embodiments. Modifications and alterations will occur to others upon reading the application. It is intended that the invention be construed as including all such modifications and alterations, including insofar as they come within the scope of the appended claims and the equivalents thereof.

What is claimed is:

1. An RF power transmitter, comprising:
an RF synthesizer that generates an analog RF signal based on an input digital waveform and a compensated dynamic complex envelope, wherein the input digital waveform includes an RF carrier description and a dynamic complex envelope, and;
a hardware amplifier that amplifies the analog RF signal and provides the amplified analog RF signal to a load; and
a compensator that generates the compensated dynamic complex envelope based on the dynamic complex envelope and digital feedback signals.

2. The RF power transmitter of claim 1, wherein the digital feedback signals include an estimated state of the RF power transmitter, estimated based on one or more models.

3. The RF power transmitter of claim 2, wherein the estimated state of the RF power transmitter includes one or more of a temperature of the RF power transmitter, a temperature surrounding the RF power transmitter, a supply voltage of an analog amplifier of the RF power transmitter, an electrical current of the analog amplifier of the RF power transmitter, a power output by the RF power transmitter, or a power reflected back from the load to the RF power transmitter.

4. The RF power transmitter of claim 1, further comprising:
an adjustable full-scale adjuster that determines a magnitude range for the analog RF signal, wherein the adjustable full-scale adjuster sets a static magnitude range.

5. The RF power transmitter of claim 1, further comprising:
a feedback component that generates the digital feedback signals, wherein the feedback signals include real-time state information about the RF power transmitter.

6. The RF power transmitter of claim 5, wherein the state information includes a thermal state of the RF power transmitter.

7. The RF power transmitter of claim 5, wherein the state information includes an output power state of the RF power transmitter.

8. The RF power transmitter of claim 7, wherein the output power state of the RF power transmitter includes at least one of a forward power or a reflected power.

9. The RF power transmitter of claim 8, wherein the output power state of the RF power transmitter includes at least one of an amplitude or a phase of the output power.

10. The RF power transmitter of claim 5, the RF power transmitter, comprising:
an analog amplifier, wherein the output power state of the RF power transmitter includes at least one of a supply voltage or electrical current of the amplifier.

11. The RF power transmitter of claim 1, wherein the hardware amplifier includes one or more of an isolator or a coupler.

12. The RF power transmitter of claim 1, wherein the load is a transmitter coil of an MR imaging system.

13. The RF power transmitter of claim 12, wherein the RF power transmitter is a component of the MR imaging system.

14. A method, comprising:
generating a compensated dynamic complex envelope based on a dynamic complex envelope of an input digital waveform and a digital feedback signal that includes real-time state information of the RE power transmitter;
generating an analog RF signal based on an RE carrier description of the input digital waveform and the compensated dynamic complex envelope;
generating, via a RF power transmitter, an amplified analog RF signal for a transmitter coil of an MR imaging system by amplifying the analog RE and creating an amplified analog RF signal; and
providing the amplified analog RF signal to the transmitter coil.

15. The method of claim 14, further comprising:
generating the compensated dynamic complex envelope based on a compensation model.

16. The method of claim 14, wherein the compensated dynamic complex envelope represents a signal that will lead to a predetermined amplified RF signal for the coil.

17. The method of claim 14, further comprising:
employing an adjustable full-scale adjuster to determine a magnitude range for the amplified analog RF signal to set a static magnitude range.

18. The method of claim 14, wherein the digital feedback signal is indicative of one or more electrical characteristics of the amplified RF signal.

19. A MR imaging system, comprising:
an RF power transmitter that generates an amplified analog RF signal, the RF power transmitter, including:
an RF synthesizer that generates an analog RF signal based on a digital waveform and a digital feedback signal, wherein the digital waveform includes an RF carrier description and a compensated dynamic complex envelope description;
a hardware amplifier that amplifies the analog RF signal, producing the amplified analog RF signal;
a hardware feedback component, where the hardware feedback component generates one or more digital feedback signals based on electrical characteristics of an output of the hardware amplifier; and
a compensator that generates the compensated dynamic complex envelope based on an estimated state of the RF power transmitter and in input envelope description,
wherein the RF power transmitter provides the amplified analog RF signal to a transmit coil of an MR imaging system.

* * * * *